United States Patent [19]

Deckman et al.

[11] Patent Number: 4,608,281

[45] Date of Patent: Aug. 26, 1986

[54] IMPROVEMENTS IN SENSITIVITY OF A POSITIVE POLYMER RESIST HAVING A GLASS TRANSITION TEMPERATURE THROUGH CONTROL OF A MOLECULAR WEIGHT DISTRIBUTION AND PREBAKED TEMPERATURE

[75] Inventors: Harry W. Deckman, Clinton; John H. Dunsmuir, Annandale, both of N.J.

[73] Assignee: Exxon Research and Engineering Co., Florham Park, N.J.

[21] Appl. No.: 760,935

[22] Filed: Jul. 31, 1985

Related U.S. Application Data

[63] Continuation of Ser. No. 629,997, Jul. 12, 1984, abandoned, which is a continuation of Ser. No. 528,178, Aug. 31, 1983, abandoned, which is a continuation-in-part of Ser. No. 426,243, Sep. 28, 1982, abandoned.

[51] Int. Cl.$^4$ .............................................. B05D 3/02
[52] U.S. Cl. ................................ 427/385.5; 430/327; 430/330; 430/347
[58] Field of Search ............................ 427/375, 385.5; 430/327, 330, 347

[56] References Cited

U.S. PATENT DOCUMENTS

| | | | |
|---|---|---|---|
| 3,535,137 | 10/1970 | Haller et al. | 427/385.5 |
| 3,827,908 | 8/1974 | Johnson et al. | 427/385.5 |
| 3,894,163 | 7/1975 | Broyde | 430/330 |
| 4,078,098 | 3/1978 | Cortellino | 427/273 |
| 4,087,569 | 5/1978 | Hatzakis | 430/327 |
| 4,476,217 | 10/1984 | Douglas et al. | 430/330 |

Primary Examiner—Sadie L. Childs
Attorney, Agent, or Firm—Ronald D. Hantman

[57] ABSTRACT

The present invention is a method to increase the sensitivity of a positive polymer resist by control of molecular weight distribution and prebake temperature. The sensitivity of a polymer positive resist is increased by baking a narrow molecular weight fraction resist below the glass transition temperature. More particularly the sensitivity is increased by the use of low average molecular weight resist of narrow molecular weight distribution.

7 Claims, 5 Drawing Figures

FIG. 4 EFFECT OF DEVELOPER CONDITIONS ON SENSITIVITY IMPROVEMENT

IMPROVEMENTS IN SENSITIVITY OF A POSITIVE POLYMER RESIST HAVING A GLASS TRANSITION TEMPERATURE THROUGH CONTROL OF A MOLECULAR WEIGHT DISTRIBUTION AND PREBAKED TEMPERATURE

This is a continuation of application Ser. No. 629,997 (now abandoned), filed July 12, 1984, which is a continuation of Ser. No. 528,178 (now abandoned), filed Aug. 31, 1983, which is a continuation-in-part of Ser. No. 426,243 (now abandoned), filed Sept. 28, 1982.

BACKGROUND OF THE INVENTION

The present invention is related to positive radiation sensitive resists used in electron and x-ray lithography.

Fine-line lithography is used to transfer patterns into a radiation-sensitive resist in many areas of micro-fabrication, e.g., materials science, optics and electronics. A radiation-sensitive resist is one in which chemical or physical changes induced by ionizing radiation allow the resist to be patterned. Most of the resists used in fine-line lithography are polymers functionally classified as belonging to two groups depending on whether their solubilities in the appropriate developers are markedly enhanced or diminished by irradiation. These resists are commonly called positive and negative resists, respectively.

A molecule of an ideal polymer resist consists basically of a chain of monomer units polymerized into a backbone composed primarily of carbon atoms. All polymer chains will not necessarily be of the same length. To characterize the distribution of polymer chain lengths, it is common to compare two different moments or averages of the distribution. For the purposes herein, the ratio of the weight average $\overline{M}_w$, to number average, $\overline{M}_n$, molecular weight will be used to characterize the distribution of polymer chain lengths. The number average molecular weight is defined as $$\overline{M}_n = \Sigma_i N_i M_i / \Sigma N_i$$

where $N_i$ is the number of moles of polymer having molecular weight $M_i$. The weight average molecular weight is defined as $$\overline{M}_w = \Sigma_i N_i M_i^2 / \Sigma N_i M_i$$

where $N_i$ is the number of moles of polymer having molecular weight $M_i$. If all polymer chains are of equal length then $\overline{M}_w / \overline{M}_n = 1$.

To use a polymer resist for lithographic patterning of a substrate, the resist must be first coated on the surface of the substrate. The resist is dissolved in a suitable solvent, and the solution is applied to the substrate by some method such as dipping or spinning. As the solvent evaporates, the resist passes from a solution to a dense, amorphous mat of tangled polymer chains. The physical and chemical properties of the resultant glassy material depend both on the characteristics of the individual polymer molecules making up the mat and on the organization of these individual polymer molecules in the mat. The organization of these individual polymer chains in the mat may be altered by baking the resist at elevated temperature. For most polymer resists there is a temperature above which the chains re-organize into a more ordered state. This is referred to as the glass transition temperature, Tg.

When a polymer resist is subjected to ionizing radiation, atomic bonds are ruptured resulting in two types of molecular rearrangements. In chain scission events, a carbon back-bone bond is broken resulting in two shorter chains, each comprising a fraction of the molecular weight of the original molecule. In crosslinking events new bonds are formed between atoms in the side groups to other side group atoms in the same or neighboring molecules. These additional bonds tie the polymer molecules together into molecules of higher molecular weight.

For both positive and negative polymer resists, the solubility of the resist in the developer increases with decreasing molecular weight. For positive resists the decrease in the molecular weight due to irradiation renders the exposed resist readily soluble in a developer in which the unexposed resist has only a very small solubility. For negative resists the converse is true.

It is common to characterize resist material by sensitivity and contrast. The sensitivity of a resist, is defined as the incident does required to cause a change in the soluability of the resist in developer sufficient for production of a lithographically useful image. For the purposes herein, a change in the solubility of resist in developer of 1,000 Å/min will be used to define the sensitivity. The sensitivity of a resist is influenced by several parameters. These include energy of the ionizing radiation, resist thickness, substrate material, polymer molecular weight, distribution of molecular weights and activity of the developer. Contrast, $\gamma$, is defined as the slope of the linear portion of the curve of remaining resist thickness versus the natural log of dose for fixed developer condition. Mathematically $\gamma = \log (Q^o/Q^1)^{-1}$ where $Q^o$ is the linearly extrapolated does for full thickness and $Q^1$ is the linearly extrapolated dose for zero remaining resist thickness after development. High contrast is desirable for obtaining better edge definition and finer lines. It should be noted that the contrast can be calculated directly from a plot of etch rate vs. dose in the exposure by computing thickness of resist remaining after development.

One of the most used positive polymer resists is poly(methylmethacrylate), PMMA. It was one of the first radiation-sensitive resist materials to have been used for fabricating electronic components. It is attractive because of a number of its properties, i.e, insensitivity to light, high resolution, ease of availability.

The properties of PMMA as a resist for electron beam lithography have been summarized by several authors, see for example, S. Greenich in *Electron Beam Technology in Microelectronic Fabrication* ed. by G. Brewer, Academic Press, New York, 1980, or N. D. Wittels in *Fine Line Lithography* ed. R. Newman, Academic Press, New York, 1980. use of PMMA as a radiation sensitive resist is described by I. Haller and M. Hatzakis, U.S. Pat. No. 3,535,137 and developer characteristics of the resist are mentioned by C. A. Cortellino, U.S. Pat. No. 4,078,098. It should be noted that improvement of sensitivity and contrast by simultaneously controlling the resist molecular weight distribution, molecular weight and baking temperature is not anticipated in this prior art.

SUMMARY OF THE INVENTION

Figure 1:
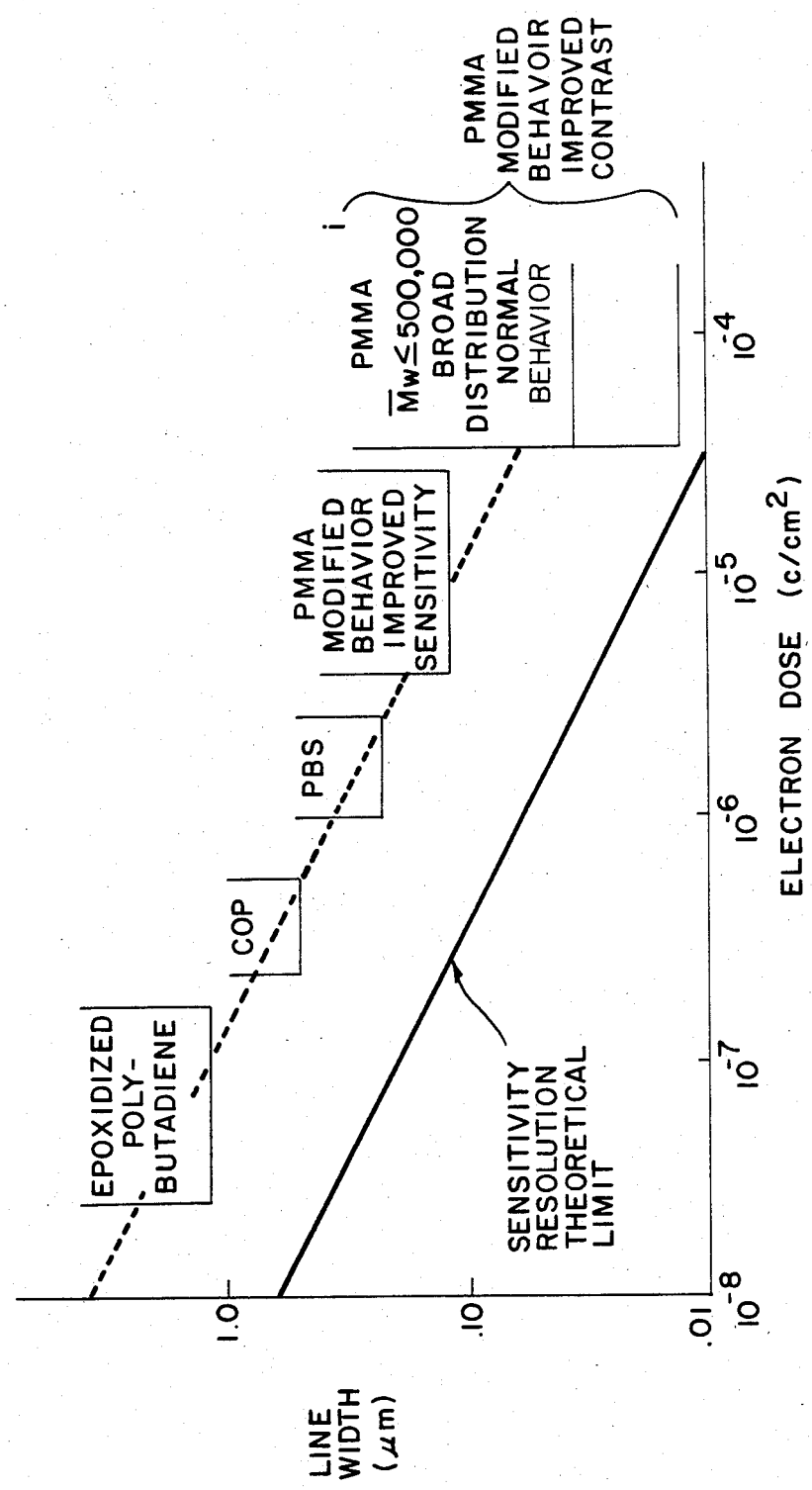
FIG. 1 shows line width as a function of electron dose for several resist materials.

The present invention is a method to increase the contrast of a polymer positive resist by baking a narrow molecular weight fraction resist above the glass transition temperature.

Another aspect of the invention is a method to increase the sensitivity of a polymer positive resist by baking a narrow molecular weight fraction resist below the glass transition temperature. More particularly both the sensitivity and contrast are increased by the use of low average molecular weight resist of narrow molecular weight distribution.

DESCRIPTION OF THE PREFERRED EMBODIMENT

For purposes of description, the present invention shall be illustrated and described with respect to the positive resist-Poly(methylmethacrylate), PMMA. PMMA was one of the first materials to be used as a radiation sensitive resist. It is widely used for studying properties of positive resists and resist development effects.

Typically, a positive resist has a broad distribution of molecular weights. A resist having a narrow distribution of molecular weights will be defined for the purposes herein as any polymer material with $\overline{M}_w/\overline{M}_n < 1.5$, where $\overline{M}_w$ and $\overline{M}_n$ are respectively the weight average and number average molecular weights. A preferred range is $\overline{M}_w/\overline{M}_n < 1$. A resist having a broad distribution of molecular weights will be defined as any polymer materials with $\overline{M}_w/\overline{M}_n > 2$. Therefore, for a typical positive resist, the method of the present invention begins by obtaining the appropriate polymer with a narrow distribution of molecular weights.

Narrow molecular weight fractions of positive resist are obtained either by fractionating a broad molecular weight distribution resist or by direct synthesis of narrow molecular weight fractions from a monomer. The resulting narrow molecular weights fraction is then dissolved in a volatile solvent to facilitate coating of the resist onto a substrate. For PMMA an appropriate solvent would be xylene.

A suitable substrate is coated with the fractionated resist by dipping in the resist-solvent solution or by placing the resist-solvent solution on a horizontal substrate and rotating the substrate in a horizontal plane thus spreading the resist over the substrate surface and dispelling the excess solution from the substrate (spinning). In either case, a thin resist film remains on the substrate after the solvent has evaporated.

After the resist has been coated on the substrate it must be baked to remove residual solvent trapped in the polymer network during the coating process. Depending upon the baking temperature, either the sensitivity or contrast can be altered for narrowly fractionated positive polymer resists. By baking above the glass transition temperature, the contrast of a narrowly fractionated resist can be improved over a broad distribution resist having the same average molecular weight. By baking narrowly fractionated resists below the glass transition temperature, the sensitivity can be improved when compared with the same material baked above the glass transition temperature. It should be noted that broad distribution resists of low molecular weight baked below the glass transition temperature are often soluble in developer and as such can be useless for producing a lithographic exposure. Thus, in analyzing the effects of baking a narrowly fractionated resist below the glass transition temperature, comparison will be made with the behavior of narrow and broad distribution materials processed above the glass transition temperature.

After the resist coated substrate has been baked, the resist is patterned by electron beam or x-ray lithography. The exposed area is then dissolved away by the developer. Typically, the developer is a mixture of solvent and nonsolvents for the resist. By increasing the solvent concentration in the developer the activity of the developer can be increased and a more agressive development of the pattern effected. As such, development conditions must be held constant to properly analyze the effects of baking a resist prior to exposure. For PMMA a particularly useful developer is a 1:1 mixture of methylisobutyl ketone (MIBK) and isopropyl alcohol (IPA). Lithographic images can be produced using this developer by immersing the exposed resist in the 1:1 mixture for 10–120 sec and washing the developed image with isopropyl alcohol for 30 sec. after development.

Figure 5:
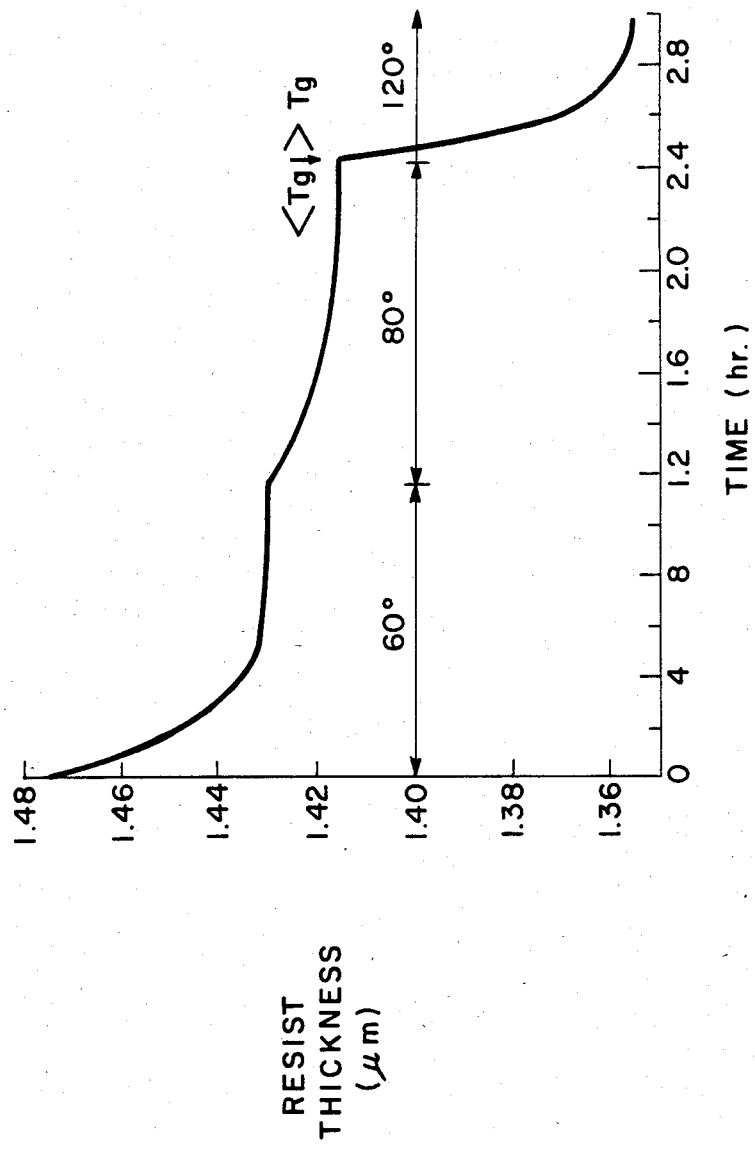
FIG. 5: Thickness of narrow distribution 79,000 Mw PMMA film as a function of annealing time. Temperature was increased successively from 60° C. to 80° and 120° C. after a steady state film thickness loss rate was established. Change in film thickness is due to solvent loss from the annealed film.

If the method of the present invention is used to increase the sensitivity of the resist, then prior to exposure the resist coated substrate is baked at temperature below the glass transition temperature of PMMA. Typically, the baking temperature is about 60° C. The bake time is typically one hour. Baking can be performed either in air or vacuum, however vacuum baking is preferred to prevent oxidation of the resist. By baking below Tg solvent remains trapped in the polymer matrix. Baking the resist below the glass transition temperature (110° C.) partially removes solvent from the coated film, while baking above the glass transition temperature completely removes trapped solvent. These effects are intimately related to the sensitivity improvement which occurs for samples baked below Tg and are quantified in Table 1 for two films spun using xylenes and chlorobenzene as solvents. Volume fraction of solvent in the filsm was determined from uv spectroscopic mesurement of $\pi-\pi^*$ transitions in the solvent molecules. Film thickness determined from profilometer measurements agreed with experimental error with the measured optical path length through the film. The volume fraction of solvent and physical film thickness were used to compute thickness of an equivalent volume fraction occupied by the polymer. It is seen that the increase in film thickness is completely due to incorporation of solvent. As such, by monitoring the thickness of films being baked, it is possible to determine the rate at which solvent is lost from the polymer network. FIG. 5 shows the time evolution of thickness in a narrow distribution PMMA film sequentially annealed at successively higher temperatures. When the film is baked at 60° C., solvent rapidly diffuses from the network for the first half hour, after which the time constant for diffusion becomes greater than 50 hr. This long time constant indicates that solvent molecules are trapped at well defined sites in the narrow distribution PMMA and must overcome activation barriers in order to escape the network. When the temperature is raised to 80° C., solvent is rapidly lost from the network during a ½ hr period after which another low "equilibrium" loss rate is established. The rapid change upon heating to 80° C. indicates that solvent molecules are trapped at inequivalent sites in the network, requiring different activation energies to escape. By sequentially heating above the glass transition temperature all solvent is driven from the film within ~½ hr and the resulting thickness of 1.355 μm can be used to compute the volume fraction of solvent in the film while annealing below Tg. Incorporation of solvent in the polymer network is reproducible as long as narrow distribution PMMA films are annealed for times long enough to establish low "equilibrium" loss rates. Reproducible solvent incorporation into the polymer network leads to consistent development characteristics.

ture can be more than a factor of 10 greater than either narrow or broad molecular weight material baked above Tg. The largest increase in sensitivity occurs at low average molecular weight where the narrow distribution resist is insoluable in a developer which dissolves broad distribution resist of the same average molecular weight. For PMMA, optimum improvements occur for narrowly fractionated resists having $\overline{M}_w \approx 75,000$. As the average molecular weight of the narrowly fractionated resist increases, the improvement in sensitivity decreases. Useful improvements in sensitivity can be effected with narrow fractionated resists having an average molecular weight as large as 500,000. It should be noted that unexposed broad distribution PMMA with $\overline{M}_w$ 70,000 is readily dissolved in the developer when baked below Tg, while the unexposed narrowly fractionated resist is slowly etched by the developer. Unexosed PMMA with $\overline{M}_w/\overline{M}_n < 1.1$ and $\overline{M}_w = 70,000$ etches at a rate of less than 75 A/minute in 1:1 mixture of MIBK and IPA. However, if the exposure process introduces an average of only 1 chain scission per molecule into the narrowly fractionated resist, etch rates of more than 350 A/min can be attained. This occurs because small alterations in the molecular weight distribution cause it to become soluble in the developer. Thus, narrowly fractionated PMMA can be rendered sufficiently sensitive so that only one chain scission per molecule is needed to substantially alter the etch rate of the resist. For a similar narrow distribution low molecular weight resist processed above the glass transition temperature, about 20 chain scissions per molecule would be required to produce such an alteration in etch rates. In general, low molecular weight narrowly fractionated resists processed below the glass transition temperature can be rendered developable with less than about 10 chain sissions per molecule. To obtain these results it is preferred that $1 \leq \overline{M}_w/\overline{M}_n \leq 1.1$ and that $\overline{M}_w$ not exceed 500,000. As $\overline{M}_w/\overline{M}_n$ increases, the improvement in sensitivity decreases and the contrast in the developed image decreases. The broadest distribution resist which could usefully be used according to the present invention has $\overline{M}_w/\overline{M}_n < 1.5$. In all cases the improvement in sensitivity can be produced without a significant loss in contrast of the resist.

If the method of the present invention is used to increase the contrast of the resist, then the coated substrate is baked at temperature above the glass transition temperature of PMMA. Typically, the baking time is about 10–30 minutes in vacuum at a temperature of about 140°–160° C. The coated substrate is then patterned by electron beam or X-ray lithography and the

TABLE 1

| | SOLVENT INCORPORATION IN PMMA FILMS BAKED BELOW AND ABOVE Tg[1,2] | | | | | |
|---|---|---|---|---|---|---|
| | Volume Fraction of Xylenes in Film | Film Thickness (μm) | Thickness of Equivalent Volume Fraction Occupied by Polymer (μm) | Volume Fraction of Chlorobenzene in Film | Film Thickness (μm) | Thickness of Equivalent Volume Fraction Occupied by Polymer (μm) |
| As Spun | 15.8% | 1.39 ± .01 | 1.17 ± .02 | 20.2 | 2.15 ± .05 | 1.72 ± .07 |
| Baked at 60° C. for 1 hr. | 8.6% | 1.30 ± .01 | 1.19 ± .02 | — | — | — |
| Baked at 130° C. for 30 min. | 0% | 1.18 ± .01 | 1.19 ± .02 | 0 | 1.82 ± .02 | 1.82 ± .02 |

[1]Films were spun at 2,000 rpm from solutions containing 10-weight percent PMMA. Volume fraction of solvent in the film was essentially independent of film thickness.
[2]Tg for polymer used was 110° C.

The sensitivity of the narrow molecular weight distribution resist baked below the glass transition temperaexposed area is then dissolved away by the developer.

The contrast of the narrow distribution resist is typically more than 50% greater than that of a broad distribution material of the same average molecular weight. For PMMA, optimum improvements in contrast occur with narrowly fractionated resist having low average molecular weight. Contrast improvement tends to decrease with increasing molecular weight. This occurs because more chain scissions per molecule are required to render high average molecule weight resists developable. As the number of chain scissions per molecule increases, the correlation between the molecular weight distribution before and after exposure decreases. For very high molecular weight resists, the molecular weight distribution after exposure is completely independent of the initial molecular weight distribution. In the case of PMMA, significant contrast improvements can be produced when the average molecular weight of the unexposed resist is less than about 300,000. Optimum improvements in contrast occur when $\overline{M}_w/\overline{M}_n \leq 1.1$. Broader molecular weight distributions would tend to decrease the improvement in contrast. The broadest molecular weight distribution useful with the present invention has $\overline{M}_w/\overline{M}_n \leq 1.5$.

FIG. 1 shows how the modifications of resist contrast and sensitivity affect the behavior of PMMA having weight averaged molecular weight, $\overline{M}_w$ less than 500,000 and $\overline{M}_w/\overline{M}_n < 1.5$. In FIG. 1 the width of lines which can be exposed in the resist is plotted as a function of electron dose (20 kev electrons) for several common resists utilized in electron beam lithography. Positive resists shown in FIG. 1 are PMMA (poly methyl methacrylate) and PBS (poly butene-1-sulfone) while negative resists shown include COP (copolymer glycidyl methacrylate-co-ethyl-acrylate) and epoxidized polybutadiene. The electron dose required to expose the resist is a direct measure of the sensitivity while the minimum line width which can be produced is related to contrast. The improvement in contrast of PMMA permits fabrication of a finer line while the improved sensitivity permits exposure with less electron dose. Also included on FIG. 1 is a theoretical sensitivity-resolution limit for resists used in electron beam lithography. It is seen that the improvement in contrast approaches the theoretical limit. Changes in the sensitivity and contrast similar to those indicated in FIG. 1 are expected when the method of the present invention is used for x-ray lithographic exposures. It should be noted that dose for x-ray exposure is measured in units of $J/cm^2$ so the abscissa in FIG. 1 will be modified. However, the proportional improvement in sensitivity and contrast for x-ray exposures should be similar to those shown in FIG. 1.

To further illustrate the invention, changes in sensitivity and contrast will be described for PMMA resists exposed with an electron beam and developed in a 1:1 mixture of isopropyl alcohol (IPA) and methyl isobutyl ketone (MIBK).

EXAMPLE 1

Figure 2:
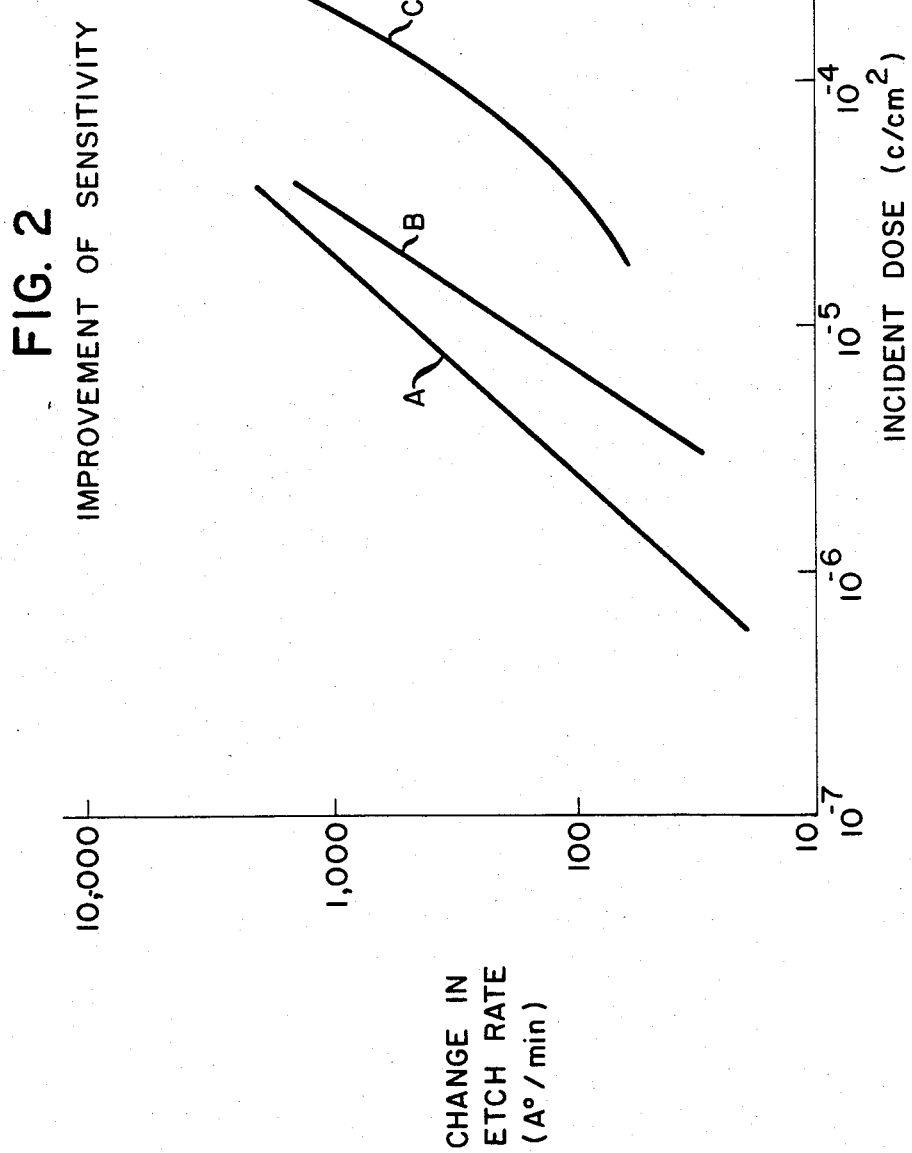
FIG. 2 presents data illustrating the improvement of sensitivity for narrow fraction resists baked below the glass transition temperature. Change of etch rates in a 1:1 MIBK:IPA developer (21° C.) as a function of electron dose are presented for the resists as follows: Curve A—Data for narrow fraction ($\overline{M}_w/\overline{M}_n \leq 1.1$) 75,000 baked below Tg; Curve B—Data for narrow fraction ($\overline{M}_w/\overline{M}_n \leq 1.1$) 130,000 $\overline{M}_w$ PMMA baked below Tg; Curve C—Behavior of wide distribution ($\overline{M}_w/\overline{M}_n \leq 3$) 130,000 $\overline{M}_n$ PMMA baked above Tg.

Referring to FIG. 2 shows the significant improvement in sensitivity obtained by baking narrow distribution low molecular weight PMMA resists below the glass transition temperature. Curve A shows the change in dissolution or etch rate as a function of dose for narrow fraction 75,000 $\overline{M}_w$ (130,000 $\overline{M}_w$ resists baked below the glass transition temperature. Curve B shows the change in dissolution or etch rate as a function of dose for narrow fraction 130,000 e,ovs/M/$_w$ resists baked below the glass transition temperature. Behavior of the wide distribution 130,000 $\overline{M}_w$ resist baked above the glass transition temperature is shown in curve C. The dose required to obtain a 1,000 Å/min change in the dissolution rate has been reduced by a factor of 10 for the 130,000 $\overline{M}_w$ narrow fraction resist (curve B) compared with the wide distribution resist (curve C). Further increases in sensitivity are noted for 75,000 $\overline{M}_w$ resist (curve A). Broad molecular weight distribution 130,000 and 75,000 resists baked below Tg are already soluble in developer and therefore not useable as positive resists. The data shown in FIG. 2 were obtained in the following manner:

(1) One gram of 75,000 $\overline{M}_w$ (Curve A) or 130,000 $M_w$ (Curve B) PMMA having $M_w/M_n \leq 1.1$ was dissolved into 20 g of xylenes;

(2) Resist was coated onto a 3 in. diameter polished silicon wafer by covering the surface with the 5% solution of PMMA and spinning at 2,000 rpm for 30 sec. Thickness of the resist coating was 2,300Å;

(3) Resist coated wafers were baked in vacuum at 65° C. for approximately one hour. This baking temperature is below the glass transition temperature of the polymer;

(4) Areas of 0.5 to 5 mm$^2$ were uniformly exposed with a 30 kev electron beam from a scanning electron microscope. Dose for each exposure was computed from measurements of beam current, exposure time and area exposed;

(5) After exposure the resist was developed in a 1:1 mixture of methyl isobutyl keytone (MIBK) and isopropyl alcohol (IPA) for either 30 or 60 seconds. Temperature of the developer bath was approximately 21° C.;

(6) Change in solubility of resist in developer due to exposure was measured by comparing the thickness of resist in exposed and unexposed areas. The change in resist thickness due to exposure was measured using optical interferometry as well as optical reflectivity. The unexposed 75,000 and 130,000 $\overline{M}_w$ resists are found to etch at a rate of 70 Å/min and 65 Å/min, respectively. These etch rates must be added to the rates shown in FIG. 2 to obtain the etch rates of the exposed resist.

For comparsion, the etch rate of a PMMA resist baked above Tg having 130,000 $M_w$ and $M_w/M_n \leq 3$ is included in FIG. 2. The etch rate is plotted for development conditions identical to those used for curves A and B. For the high temperature baked resist (curve C) the etch rate of the unexposed material is less than 10 Å/min.

EXAMPLE 2

Figure 3:
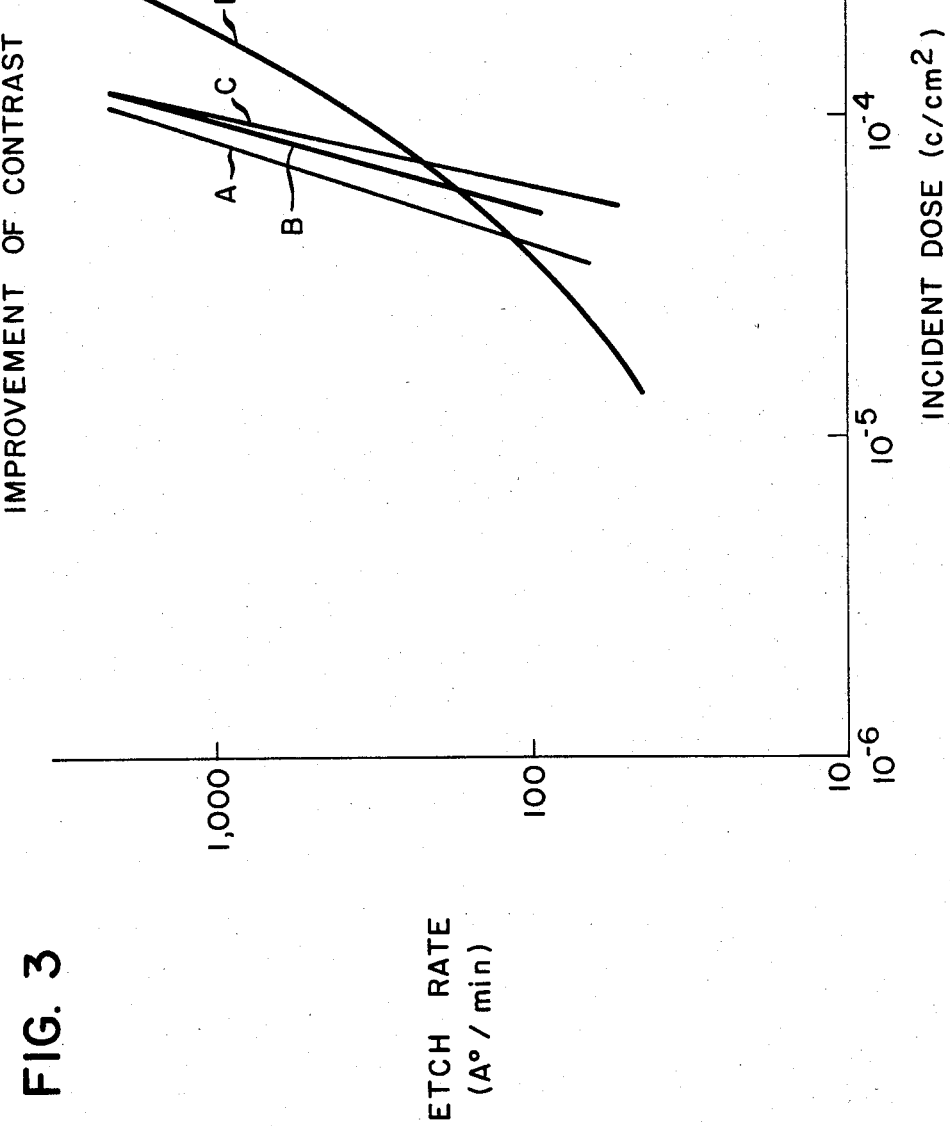
FIG. 3 presents data illustrating the improvement of contrast for narrow fraction resists baked above the glass transition temperature. Etch rates in a 1:1 MIBK:IPA developer (21° C.) as a function of electron dose are presented for the resists as follows: Curve A—Data for narrow fraction ($\overline{M}_w/\overline{M}_n \leq 1.1$) 79,000 $\overline{M}_w$ PMMA baked above Tg; Curve B—Data for narrow fraction ($\overline{M}_w/\overline{M}_n \leq 1.1$) 130,000 $\overline{M}_w$ PMMA baked above Tg; Curve C—Data for narrow fraction ($\overline{M}_w/\overline{M}_n \leq 1.1$) 75,000 $\overline{M}_w$ PMMA baked above Tg; Curve D—Behavior of wide distribution ($\overline{M}_w/\overline{M}_n \leq 3$) 80,000–130,000 $\overline{M}_n$ baked above Tg.

FIG. 3 shows the improved contrast obtained for resists of narrow molecular weight distribution when compared to contrast obtained from broad distribution resists of the same average molecular weight which were identically prepared. Improvement of contrast is due to baking narrow fraction low molecular weight resists above the glass transition temperature. Curves A, B and C show the behavior of narrow distribution PMMA resists having $\overline{M}_w$=79,000, 130,000 and 75,000 respectively. Curve D shows the behvior of broad distribution resists having $\overline{M}_w/\overline{M}_n > 3$ and $80,000 \leq \overline{M}_n \leq 130,000$. The slope of the curves shown in FIG. 3 can be directly used to calculate contrast of the resists. For the narrow distribution resists with $\overline{M}_n$=75,000, 79,000, and 130,000 the computed contrast ($\gamma$) is 6.2, 4.5 and 4.6, respectively. Contrast of the broad distribution resists with $80,000 \leq \overline{M}_n \leq 130,000$ is found to be=2.8. Thus, the contrast of low molecular weight narrowly fractionated resists is more than 50% greated than similar wide distribution resists. All resists were prepared in the same manner as Example 1 with the following exceptions:

(1) Resists were baked at 150°±10° C. for about 15 min. instead of 65° C. used in Example 1. The 150° C. baking temperature is above the glass transition temperature of PMMA. Etch rates of unexposed PMMA resists baked about Tg were less than 10 A/min.

EXAMPLE 3

Figure 4:
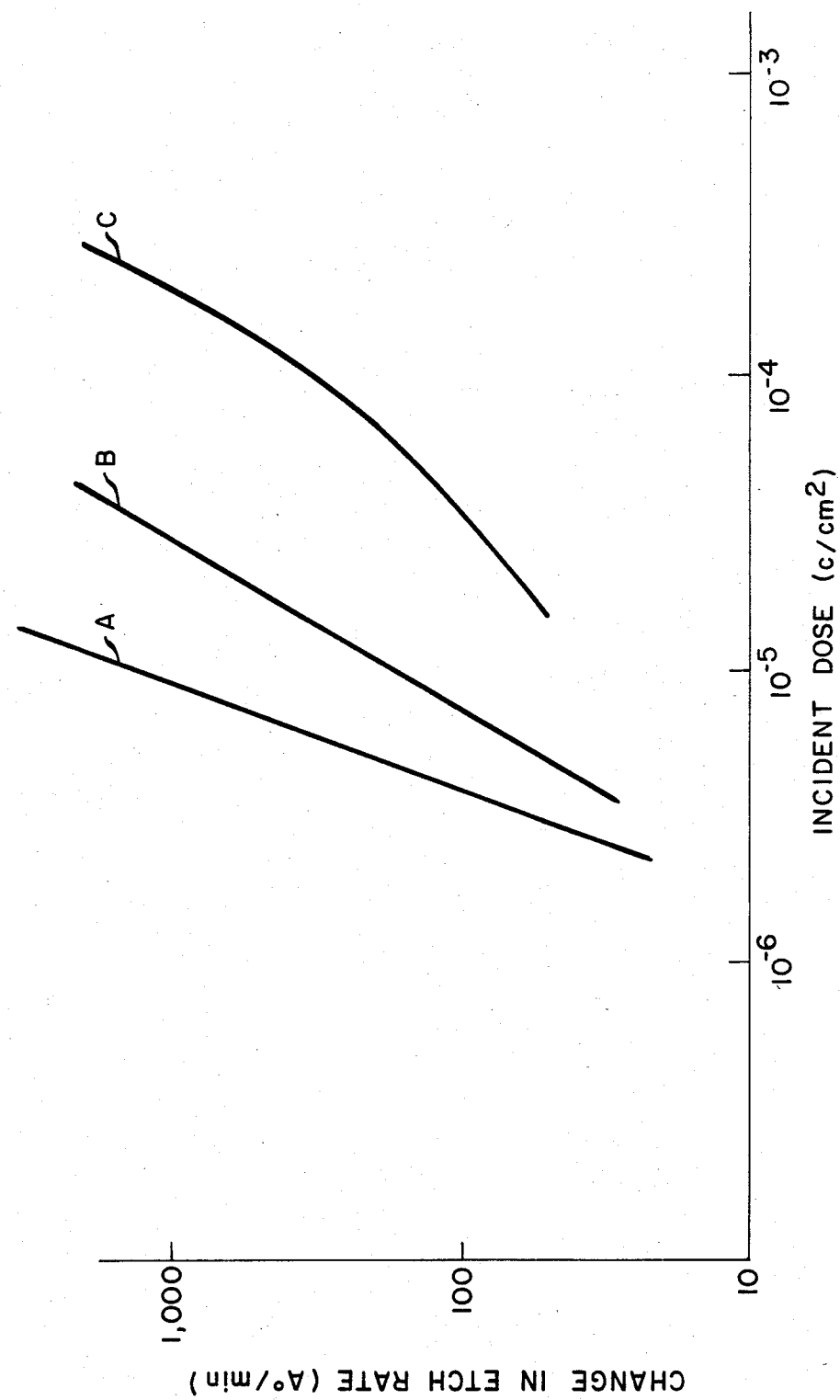
FIG. 4 presents data illustrating the effect of developer activity on the improvement of sensitivity for narrow fraction resists baked below the glass transition temperature. Change of etch rates as a function of electron dose are presented for the resist materials and development conditions as follows: Curve A—Data for narrow fraction ($\overline{M}_w/\overline{M}_n \leq 1.1$) 130,000 $\overline{M}_w$ PMMA baked below Tg and developed at 31° C. in a 1:1 MIBK:IPA mixture; Curve B—Data for narrow fraction ($\overline{M}_w/\overline{M}_n \leq 1.1$) 130,000 $\overline{M}_w$ PMMA baked below Tg and developed at 21° C. in a 1:1 MIBK:IPA mixture; Curve C—Behavior of wide distribution ($\overline{M}_w/\overline{M}_n \leq 3$) 80,000–130,000 $\overline{M}_n$ baked above Tg and developed at 21° C. in a 1:1 MIBK:IPA mixture.

FIG. 4 illustrates the effect of developer conditions on the improvements in resist sensitivity. Curves A and B show the change in dissolution rate of narrowly fractionated 130,000 $\overline{M}_n$ PMMA baked below Tg when developed at 21° and 31° C., respectively in a 1:1 MIBK:IPA mixture. For comparison, behavior of wide distribution resists $80,000 \leq \overline{M}_n \leq 130,000$ baked above Tg and developed at 21° C. is shown in FIG. 4. Increasing development temperature from 21° C. to 31° C. increases the activity of the developer. Comparison of curves A and B shonws that sensitivity of the resist increases with developer activity. Developer activity can also be affected by changing the solvent (MIBK) to nonsolvent (IPA) ratio in the developer. All changes in developer activity are found to affect either sensitivity or contrast. As such, to properly assess the effect of molecular weight distribution on sensitivity and contrast, developer conditions must be held constant.

What is claimed is:

1. A method of increasing the sensitivity of a positive polymer resist having a glass transition temperature comprising:
   A. obtaining a narrow molecular weight fraction positive polymer resist having $1 \leq M_w/M_n < 1.5$ and $M_w < 500,000$ where $M_w$=weight-average molecular weight and $M_n$=number-average molecular weight, said resist dissolved in a solvent;
   B. coating a substrate with said narrow fraction resist such that a portion of said solvent remains trapped in said coating; and
   C. baking said narrow fraction resist coated substrate at a temperature such that a portion of said solvent remains trapped in said coating.

2. The method of increasing sensitivity of a positive polymer resist of claim 1 such that the sensitivity is increased by at least a factor of two over the same resist material having a broad distribution of molecular weights.

3. The method of increasing the sensitivity of a positive polymer resist of claim 1 such that said resist is made developable with less than 10 chain scissions per molecule.

4. The method of claim 2 wherein said polymer is PMMA.

5. The method of claim 1 wherein said fractional resists has $1 < \overline{M}_w/\overline{M}_n < 1.1$.

6. The method of claim 4 wherein said baking step is performed at a temperature within the range of 50° C. and 60° C.

7. The method of claim 1 wherein the narrow fraction resist is insoluble in developer in which the broad fraction resist is readily soluble.

* * * * *